United States Patent [19]
Ueno et al.

[11] Patent Number: 5,596,295
[45] Date of Patent: Jan. 21, 1997

[54] IN-PHASE SIGNAL OUTPUT CIRCUIT, OPPOSITE-PHASE SIGNAL OUTPUT CIRCUIT, AND TWO-PHASE SIGNAL OUTPUT CIRCUIT

[75] Inventors: Masaji Ueno, Sagamihara; Yasukazu Noine, Chigasaki, both of Japan

[73] Assignee: Kabushiki Kaisha Toshiba, Kawasaki, Japan

[21] Appl. No.: 405,009

[22] Filed: Mar. 16, 1995

[30] Foreign Application Priority Data

Mar. 16, 1994 [JP] Japan .................................. 6-045778

[51] Int. Cl.$^6$ ...................................................... H03K 5/12
[52] U.S. Cl. ........................ 327/170; 327/171; 327/374; 327/387; 327/391; 327/432; 327/482; 326/17; 326/18
[58] Field of Search ............................. 326/17, 18, 21, 326/26, 27, 34; 327/170, 171, 374, 376, 377, 379, 384, 387, 389, 427, 432, 434, 436, 478, 482, 391

[56] References Cited

U.S. PATENT DOCUMENTS

| | | | |
|---|---|---|---|
| 4,103,188 | 8/1978 | Morton . | |
| 4,498,021 | 2/1985 | Uya ............................................. | 326/17 |
| 4,558,234 | 12/1985 | Suzuki et al. . | |
| 4,779,013 | 10/1988 | Tanaka ....................................... | 327/374 |
| 4,829,199 | 5/1989 | Prater ......................................... | 326/27 |
| 4,871,928 | 10/1989 | Bushey . | |
| 4,933,574 | 6/1990 | Lien et al. ................................... | 326/26 |
| 4,958,089 | 9/1990 | Fitzpatrick et al. ........................ | 326/17 |
| 5,063,308 | 11/1991 | Borkar ........................................ | 326/26 |
| 5,128,555 | 7/1992 | Millman ..................................... | 327/170 |
| 5,191,245 | 3/1993 | Kang .......................................... | 327/170 |
| 5,293,082 | 3/1994 | Bathaee ...................................... | 327/170 |
| 5,410,189 | 4/1995 | Nguyen ...................................... | 327/374 |

FOREIGN PATENT DOCUMENTS

| | | |
|---|---|---|
| 0310232 | 4/1989 | European Pat. Off. . |
| 0621693 | 10/1994 | European Pat. Off. . |
| 62-193316 | 8/1987 | Japan .................................... 327/170 |

*Primary Examiner*—Terry Cunningham
*Attorney, Agent, or Firm*—Oblon, Spivak, McClelland, Maier & Neustadt, P.C.

[57] ABSTRACT

In an output circuit, a signal /φ opposite in phase to a signal /EN inputted through an input terminal 3 is generated by an inverter 1, and a signal φ in phase with the signal /EN is generated by two inverters 8 and 2. When the input signal /EN changes from a high level to a low level, a bipolar NPN transistor 35 is turned on instantaneously to decide an output terminal 5 at the low level forcedly. On the other hand, when the signal /EN changes from the low level to the high level, an NPN transistor 10 is turned on in advance of the other circuits to decide the output terminal 5 at the high level forcedly. Accordingly, it is possible to roughly equalize a delay time (from when the level of the input signal /EN changes at the input terminal 3 to when the level of the signal /φ changes at an output terminal 4) to another delay time (to when the level of the signal φ changes at the output terminal 5), thus realizing an ideal phase relationship between the two signals/φ and φ at two output terminals 4 and 5.

12 Claims, 4 Drawing Sheets

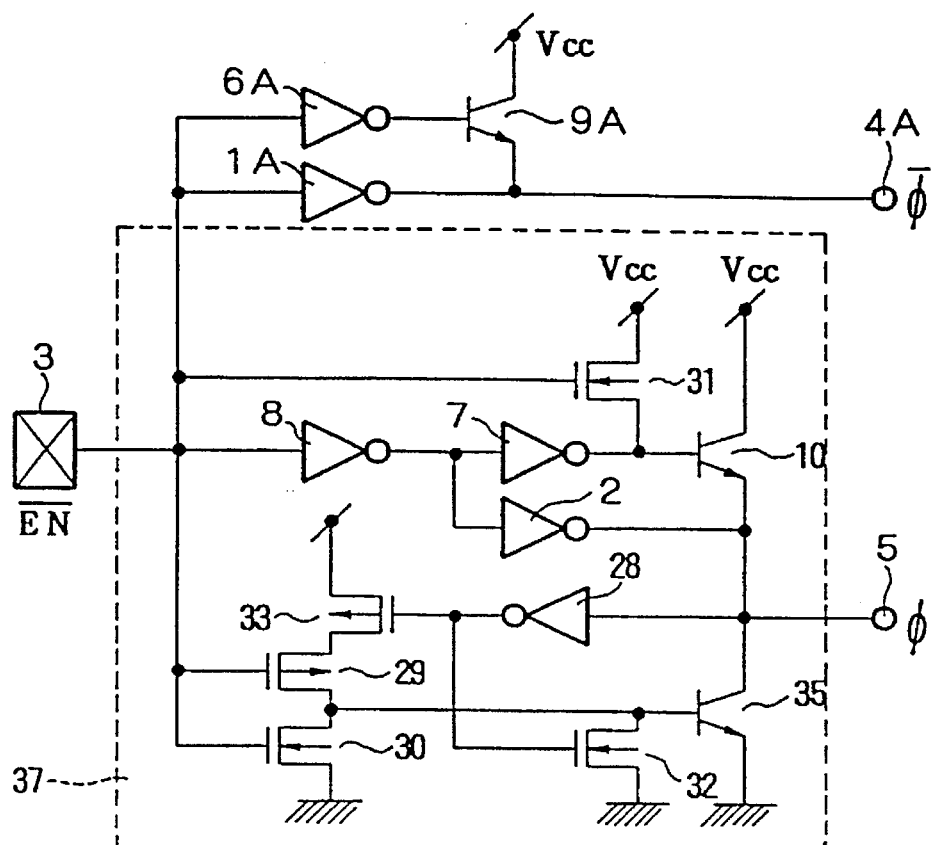
F I G. 1
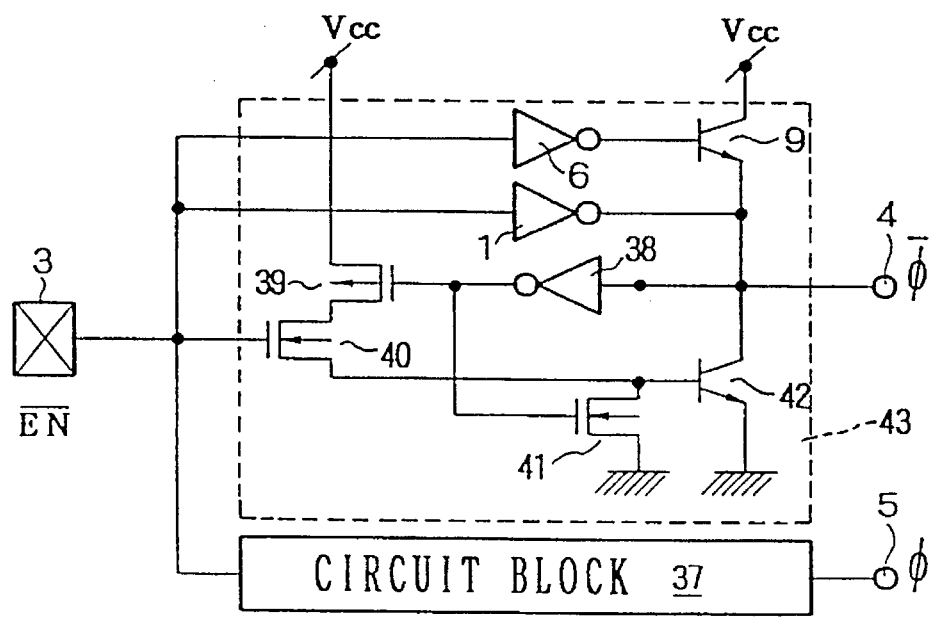
F I G. 2

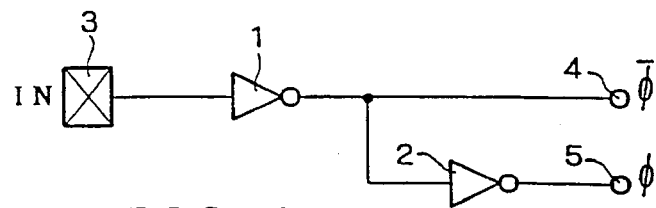
FIG. 4
PRIOR ART
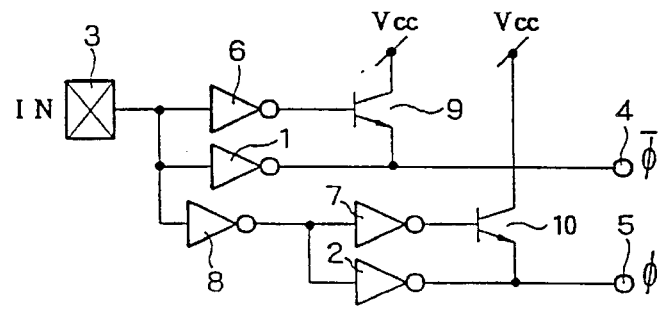
FIG. 5
PRIOR ART
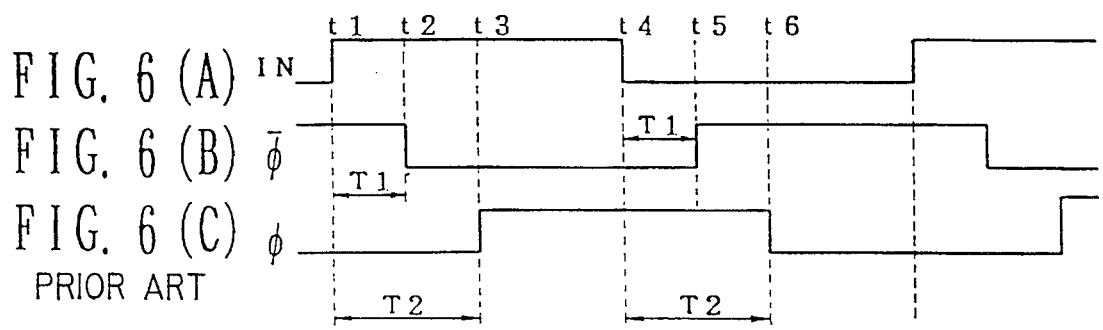
FIG. 6 (A) IN
FIG. 6 (B) $\bar{\phi}$
FIG. 6 (C) $\phi$
PRIOR ART

IN-PHASE SIGNAL OUTPUT CIRCUIT, OPPOSITE-PHASE SIGNAL OUTPUT CIRCUIT, AND TWO-PHASE SIGNAL OUTPUT CIRCUIT

FIELD OF THE INVENTION

The present invention relates to an in-phase signal output circuit, an opposite-phase output circuit, and a two-phase signal output circuit, and more specifically to a circuit for controlling the phase relationship between two-phase signals generated in response to a single-phase signal in a BiCMOS circuit.

BACKGROUND OF THE INVENTION

FIG. 4 shows a first example of prior art signal output circuits. In this circuit, a signal IN inputted through an input terminal 3 is inverted by an inverter 1, and then outputted through an output terminal 4 as a signal /φ opposite in phase to the input signal IN. Further, the signal inverted by the inverter 1 is further inverted by another inverter 2, and then outputted through another output terminal 5 as a signal φ in phase with the input signal IN.

The operation of the circuit shown in FIG. 4 will be described hereinbelow.

The signal inputted through the input terminal 3 is inverted by the inverter 1, and then outputted through the output terminal 4 as an opposite-phase signal /φ with respect to the input signal IN. On the other hand, the signal inputted through the input terminal 3 is inverted by the inverter 1 and further by the inverter 2, and then outputted through the output terminal 5 as an opposite-phase signal φ with respect to the signal /φ outputted through the output terminal 4.

Therefore, the signal /φ outputted through the output terminal 4 is perfectly opposite in phase to the signal φ outputted through the output terminal 5 from the logical standpoint. In practice, however, the mutual phase relationship between the two is not necessarily accurate due to a delay of the inverter 2.

In more detail with reference to FIG. 6, the output signal /φ (as shown by (B)) outputted through the output terminal 4 is delayed from the input signal IN (as shown by (A)) due to a delay time of the inverter 1. On the other hand, the output signal φ (as shown by (C)) outputted through the output terminal 5 is delayed from the input signal IN due to delay times of both the inverters 1 and 2.

Accordingly, when the input signal IN rises at a time t1 and falls at a time t4 as shown by (A) in FIG. 6, the signal /φ outputted through the output terminal 4 falls at a time t2 and rises at a time t5 due to a delay time T1 of the inverter 1 as shown by (B). On the other hand, the signal φ outputted through the output terminal 5 rises at a time t3 and falls at a time t6 due to an addition T2 of the two delay times of the two inverters 1 and 2 as shown by (C).

FIG. 5 shows a second example of prior art signal output circuits. In this circuit, a signal IN inputted through an input terminal 3 is given to three inverters 1, 8 and 6, respectively. The output of the inverter 6 is given to the base of an NPN transistor 9. The collector of this NPN transistor 9 is pulled up by a supply voltage Vcc, and the emitter thereof is connected to an output of an output terminal 4 together with an output of the inverter 8. On the other hand, an output of the inverter 8 is given to other two inverters 7 and 2, respectively. An output of the inverter 7 is given to the base of an NPN transistor 10. The collector of this NPN transistor 10 is pulled up by the supply voltage Vcc, and then connected to an output terminal 5 together with the output of the inverter 2.

The operation of this circuit shown in FIG. 5 will be described hereinbelow.

When the input signal IN inputted through the input terminal 3 falls from a high level to a low level, the outputs of the three inverters 1, 6 and 8 rise to the high level, respectively. Since the output of the inverter 6 in at the high level, the NPN transistor 9 is turned on, so that the output terminal of the inverter 1 (i.e., the signal /φ at the output terminal 4) is pulled up to the high level toward the supply voltage Vcc. In other words, when the level at the output terminal 4 is pulled up from the low level to the high level, the NPN transistor 9 serves to increase the drive capability of the circuit, that is, the circuit response speed, in particular when a heavy load is connected to the output terminal 4. On the other hand, when the input signal IN inputted through the input terminal 3 falls from the high level to the low level, the output level of the inverter 8 changes to the high level. As a result, the output levels of the two inverters 7 and 2 change to the low level. Therefore, since the output of the inverter 7 is given to the base of the NPN transistor 10, the NPN transistor 10 is turn off, so that the signal φ outputted through the output terminal 5 changes to the low level.

In contrast with this, when the input signal IN inputted through the input terminal 3 rises from the low level to the high level, the outputs of the three inverters 1, 6 and 8 fall to the low level, respectively. Since the output of the inverter 6 is at the low level, the NPN transistor 9 is turned off, so that the output terminal of the inverter 1 (i.e., the signal /φ at the output terminal 4) is disconnected from the supply voltage Vcc. On the other hand, the low-level signal /φ is outputted to the output terminal 4 through the inverter 1.

On the other hand, when the input signal IN inputted through the input terminal 3 rises from the low level to the high level, the output level of the inverter 8 changes to the low level. As a result, the output levels of the two inverters 7 and 2 change to the high level. Therefore, since the output of the inverter 7 is given to the base of the NPN transistor 10, the NPN transistor 10 is turned on, so that the signal φ outputted through the output terminal 5 is pulled up from the low level to the high level. As a result, the level of the signal φ outputted through the output terminal 5 changes to the high level. In this case, it is possible to increase the drive capability of the circuit, that is, to improve the circuit response speed when a heavy load is connected to the output terminal 4.

In the prior art circuit as shown in FIG. 5, however, since the number of the inverters connected between the input terminal 3 and the output terminal 4 is different from that between the input terminal 3 and the output terminal 5 in the same way as with the case of the circuit shown in FIG. 4, although the drive capability can be it proved by the presence of the two NPN transistors 9 and 10, since there exists basically a difference in delay time between the two routes, it is impossible to obtain the accurate opposite-phase relationship between the signal /φ outputted through the terminal 4 and that φ outputted through the terminal 5.

FIG. 7 shows a third example of prior art signal output circuits. In this circuit, an enable signal /EN inputted through an input terminal 3 is inverted by an inverter 1, and then given to two NAND circuits 11 and 12 and an inverter 2. An output of the inverter 2 is given to two NOR circuits 13 and 14 via an output terminal 5. On the other hand, a data signal D-In inputted through an input terminal 44 is given to a NAND circuit 11. An output of the NAND circuit 11 is given to a NOR circuit 13 and an inverter 15. An output of the inverter 15 is given to a NOR circuit 14. An output of the NOR circuit 13 is given to the base of an NPN transistor 22. The collector of the transistor 22 is pulled up by a supply voltage Vcc, and the emitter thereof is connected to the base of a transistor 23. The collector of the transistor 23 is pulled up by the supply voltage Vcc, and the emitter thereof is connected to an output terminal 45. The output of the NOR circuit 14 is applied to the gate of an NMOS transistor 17, and the output of the NAND circuit 12 is applied to the gate of an NMOS transistor 16. The drain of the MOS transistor 17 is pulled up by the supply voltage Vcc via a resistor 21. Further, the source of the MOS transistor 17 is connected to the drain of the MOS transistor 16, and the source of the MOS transistor 16 is connected to ground GND. The drain of the MOS transistor 17 is connected to the emitter of the transistor 22 via a Zener diode 19 and similarly to the emitter of the transistor 23 via another Zener diode 18. Further, a resistor 20 is connected between the emitters of the two transistors 22 and 23. Further, a junction point between the source of the MOS transistor 17 and the drain of the MOS transistor 16 is connected to the base of an NPN transistor 24. The emitter of the transistor 24 is connected to the ground GND, and the emitter of the transistor 23 is connected to an output terminal 45 through which a signal Q is outputted.

The operation of the circuit shown in FIG. 7 will be described hereinbelow.

The circuit shown in FIG. 7 constructs a buffer circuit provided with three-state functions. On the basis of the signal /EN inputted through the input terminal 3 and the signal D-IN inputted through the input terminal 44, the level of the output terminal 45 can be controlled to one of three levels (a low level, a high level, and a high inpedance).

Here, if the data D-IN inputted through the input terminal 44 is at the low level, the output of the NAND circuit 11 is at the high level, so that the output of the NCR circuit 13 is at the low level and the output of the inverter 15 is at the low level. In other words, the NOR circuit 14 and the NAND circuit 12 function as an inverter for an input signal inputted through the other input terminal.

Under these conditions, since the base of the transistor 22 is at the low level, the transistor 22 is turned off, so that the transistor 23 is also turned off.

Under these conditions, when the signal /EN inputted through the input terminal 3 is at the low level, since the output of the inverter 1 is at the high level, the output of the inverter 2 is at the low level.

As a result, the output of the NAND circuit 12 is at the low level. Since this low-level signal is applied to the gate of the MOS transistor 16, the transistor 16 is turned off.

On the other hand, the output of the NOR circuit 14 changes to the high level, so that the MOS transistor 17 is turned on in response to this high-level signal. As a result, a base current is supplied from the supply voltage Vcc to the base of the transistor 24 through a resistor 21 to turn on the transistor 24, so that the low-level signal is outputted through the output terminal 45.

On the other hand, when the signal /EN inputted to the input terminal 2 is at the high level, the output of the inverter 1 is at the low level and that of the inverter 2 is at the high level.

As a result, the output of the NAND circuit 12 is at the high level, so that the MOS transistor 16 is turned on in response to this high-level signal.

On the other hand, the output of the NOR circuit 14 is at the low level, so that the MOS transistor 17 is turned off in response to this low-level signal.

As a result, since the base of the transistor 24 is connected to the ground GND through the MOS transistor 16, the transistor 24 is turned off. On the other hand, since the transistor 23 is turned off, the output terminal 45 changes to a high impedance output state.

In contrast with this, when the data D-IN inputted through the input terminal 44 is at the high level, the NAND circuit 11 functions as an inverter for a signal inputted to the other input terminal thereof.

Under these conditions, when the signal /EN inputted through the input terminal 3 is at the low level, the output of the inverter 1 is at the high level; the output of the NAND circuit 11 is at the low level; and the output of the inverter 15 is at the high level. That is, the output of the NOR circuit 14 changes to the low level, so that the output of the NAND circuit 12 changes to the high level.

As a result, the gate of the MOS transistor 17 is at the low level, and the gate of the MOS transistor 16 is at the high level. As a result, the MOS transistor 17 is turned off, and the MOS transistor 16 is turned on, so that the base of the transistor 24 is connected to the ground GND; that is, the transistor 24 is turned off.

On the other hand, since the output of the inverter 2 is at the low level, the output of the NOR circuit 13 is at the high level.

Under these conditions, since the base of the transistor 22 is at the high level, the transistor 22 is turned on, so that a base current is supplied from the supply voltage Vcc to the base of the transistor 23 through the emitter of the transistor 22. As a result, a high-level signal Q is outputted through the output terminal 45.

On the other hand, under these conditions, when the signal /EN inputted through the input terminal 3 changes to the high level, since the output of the inverter 1 changes to the low level, the outputs of the inverter 2 and the NAND circuit 11 are both at the high level. As a result, the output of the NOR circuit 13 is at the low level; the output of the inverter 15 is at the low level; the output of the NOR circuit 14 is at the low level; and the output of the NAND circuit 12 is at the high level.

Under these conditions, since the output of the NOR circuit 13 is at the low level, the transistor 22 is turned off. Therefore, the transistor 23 whose base is connected to the emitter of the transistor 22 is also turned off.

On the other hand, the gate of the MOS transistor 17 is at the low level, and the gate of the MOS transistor 16 is at the high level. As a result, the MOS transistor 17 is turned off; the MOS transistor 16 is turned on; and the base of the transistor 24 is connected to the ground GND. Therefore, the transistor 24 is turned off.

As a result, the two transistors 23 and 24 are both turned off, so that the output terminal 45 is kept at a high impedance state.

In other words, the output state of the output terminal 45 can be controlled into three states on the basis of the level of the input signal /EN at the input terminal 3 and the levels of the two-phase signals of the input signal D-IN at the input terminal 44. Here, the circuit operation is taken into account by designating the output signals of the two inverters 1 and 2 as /ϕ and ϕ, respectively as shown in FIG. 7.

In this case, when the three-state control is constructed by logic on the basis of internal two-phase signals of /ϕ and ϕ, the response speed of the circuit is inevitably decided on the basis of the level change of a more delayed signal of the two signals /φ and φ, that is, the change of the signal φ in phase with the signal /EN.

In more practice, when the signal /EN changes from the high level to the low level and the signal /φ changes to the high level, the two NAND circuits 11 and 12 change from the disable state to the enable state. However, in order to output the high or low level through the output terminal 45, the two NOR circuits 13 and 14 must output a normal signal, respectively.

Therefore, it is to be understood that the response speed of the circuit as shown in FIG. 7 depends upon the delay time between the signal /EN inputted through the input terminal 3 and the signal φ obtained through the two inverters 1 and 2. In other words, in the case of the control on the basis of one-phase input inversion signal of the signal /EN, the delay time can be minimized. In the case of logic on the basis of the one-phase input in-phase signal control or two-phase signal control, however, since the response speed is dependent upon that of the more delayed signal, the response speed of the circuit is inevitably reduced.

In the prior art signal output circuits constructed as described above, where two-phase signals are generated in response to one-phase signal and the generated signals are applied to a latch circuit, a flip-flop circuit, a three-state logic circuit, etc., since these circuits are basically provided with the alternating characteristics, there inevitably exists an imbalance in delay time in the internal circuits, so that it is difficult to keep constant the phase relationship between the generated two-phase signals stably. In particular, when these two-phase signals are used as clocks, this causes an erroneous operation of the circuit, thus resulting in a serious problem. In particular, when the operation speed of the circuit increases, there exists such a possibility that the two-phase signals become in phase with respect to each other in an extreme case. Therefore, when these signals are used as clock signals, a problem arises in that an erroneous operation such as hazard, the absence of data, etc. occurs. These problems may be overcome by positively delaying the leading signal so that the phase thereof can match that of the more delayed signal. However, this method is not preferable when a high operation speed is required for the output circuit. Accordingly, an effective method of operating the output circuit on the basis of multi-phase clocks has been so far required.

SUMMARY OF THE INVENTION

With these problems in mind, therefore, it is the object of the present invention to provide a signal output circuit for outputting two-phase signals, which can delay the two-phase signals by roughly an equal delay time, respectively through the minimum possible signal pass routes, with utilization of the polarity of input signals of BiCMOS elements.

To achieve the above-mentioned object, the present invention provides a signal output circuit, comprising: an input terminal (3) for receiving an input signal (/EN); a signal output circuit (8, 2; 1) having an output-side terminal for outputting at least one of signals in phase with and opposite in phase to the input signal (/EN); an output terminal (5; 4) connected to the output-side terminal; and a low-level signal output circuit (28 to 30, 32, 33, 35; 38 to 42) for, when said signal output circuit (8, 2; 1) outputs a low-level signal in response to the input signal (/EN), outputting the low-level signal and further applying the outputted low-level signal to said output terminal (5, 4), before the low-level signal is outputted from said signal output circuit (8, 2; 1).

Here, the signal output circuit is an in-phase signal output circuit (8, 2) for outputting an output signal in phase with the input signal (/EN) or an opposite-phase signal output circuit (1) for outputting an output signal opposite in phase to the input signal (/EN).

Further, the signal output circuit is an in-phase signal output circuit (8, 2) for outputting a signal in phase with the input signal and an opposite-phase signal output circuit (1) for outputting an output signal opposite in phase to the input signal.

Further, the signal output circuit is composed of two inverters (8, 2) connected in series or is a single inverter (1).

Further, the low-level signal output circuit is connected between said input terminal and said output terminal, and applies the low-level signal to said output terminal on the basis of the signals at said input terminal and the output-side terminal.

Further, the low-level signal output circuit (28 to 30, 32, 33, 35; 38 to 42) comprises: switching elements (35; 42) connected between said output terminal (5; 4) and ground terminal; a control circuit (28 to 30, 32, 33; 38 to 41) connected between said input terminal (3) and the output-side terminal and further to a control terminal of said switching element (35; 42); and when a level of the input signal (/EN) applied to said input terminal (3) changes to a level for changing an output level of said output terminal (5; 4) to the low level, said control circuit turning on said switching element (35; 42) in response to the input signal (/EN), prior to the low-level output of said signal output terminal.

Further, the low-level signal output circuit (28–30, 32, 33, 35) outputs the low level signal when the input signal (/EN) is at the low level; and a control circuit (28 to 30, 32, 33) of said low-level signal output circuit (28 to 30, 32, 33, 35) comprises: a first P-channel transistor (33), a second P-channel transistor (29) and a third N-channel transistor (30) all connected in series between a high voltage supply terminal and a ground terminal; a switching element (35) of N-channel transistor; a fourth N-channel transistor (32) connected between a control terminal of said switching element and the ground terminal; an inverter (28) connected between said output-side terminal and a control terminal of said first transistor (33); and control terminals of said second and third transistors (29, 30) being connected to said input terminal (3), a junction point between said second and third transistors being connected to a control terminal of said switching element (35), and an output terminal of said inverter (28) being connected to a control terminal of said fourth transistor (32).

Further, the low-level signal output circuit (38 to 42) outputs the low level signal when the input signal (/EN) is at the high level; and a control circuit (38 to 41) of said low-level signal output circuit (38 to 42) comprises: a switching element (42) of P-channel transistor; a fifth P-channel transistor (39), a sixth N-channel transistor (40), and a seventh N-channel transistor (41) connected between a control terminal of said switching element (42) of P-channel transistor and a ground terminal, all connected in series between a high voltage supply terminal and the ground terminal; and an inverter (38) connected between said output-side terminal and a control terminal of said fifth transistor (39); and a control terminal of said sixth transistor (40) being connected to said input terminal (3), an output terminal of said inverter (38) being connected to a control terminal of said seventh transistor (41).

Further, the signal output circuit further comprises: a switching element (10) connected between a high voltage supply terminal and said output terminal (5); a switching element (31) connected between the high voltage supply terminal and a control terminal of said first switching element (10), a control terminal of said second switching element (31) being connected to said input terminal (3); and an inverter (7) connected between a junction point between a pair of said inverters (8, 2) and a control terminal of said first switching element (10).

Further, the signal output circuit further comprises: an opposite-phase signal output terminal (4A) for outputting a signal opposite in phase to the input signal (/EN) applied to said input terminal (3); a switching element (9A) connected between a high voltage supply terminal and said opposite-phase signal output terminal (4A); an inverter (6A) connected between said input terminal (3) and a control terminal of said switching element (9A); and an inverter (1A) connected between said input terminal (3) and said opposite-phase signal output terminal (4A).

Further, the signal output circuit further comprises: a switching element (9) connected between a high voltage supply terminal and said output terminal (4); and an inverter (6) connected between said input terminal (3) and a control terminal of said switching element (9).

Further, the present invention provides an in-phase signal output circuit for outputting an output signal in phase with an input signal (/EN) applied to an input terminal (3) from an output terminal (5), which comprises; a first switching element (10) and a second switching element (35) connected in series between a high voltage supply and a low voltage supply, a junction point between said first and second switching elements (10, 35) being connected to the output terminal (5); a third switching element (31) turned on/off in response to an H/L level signal applied to the input terminal (3) and connected between the high voltage supply and a control terminal of said first switching element (10) in such a way that said first switching element (10) is turned on whenever said third switching element (31) is turned on; an even-stage of inverters (8, 2) connected between the input terminal (3) and the first output terminal (5); and a circuit (28 to 30, 33) connected between the input terminal (3) and a control terminal of said second switching element (35), for keeping said second switching element (35) turned off when an input signal applied to the input terminal (3) is in a steady state, but for turning said second switching element (35) from off to on transitionally at a high response speed to change in the input signal level when the input signal applied to the input terminal changes from H-level to L-level.

Further, the present invention provides an opposite-phase signal output circuit for outputting an output signal opposite in phase to an input signal (/EN) applied to an input terminal (3) from a output terminal (4), which comprises; a fourth switching element (9) and a fifth switching element (42) connected in series between a high voltage supply and a low voltage supply, a junction point between said fourth and fifth switching elements (9, 43) being connected to the output terminal (4); a first inverter (6) connected between the input terminal (3) and a control terminal of said fourth switching element (9); a second inverter (1) connected between the input terminal (3) and the output terminal (4); and switching means (38 to 40) connected between the input terminal (3) and a control terminal of said fifth switching element (42), for keeping said fifth switching element (42) turned off when an input signal applied to the input terminal (3) is in a steady state, but for turning said fifth switching element (42) from off to on transitionally at a high response speed to change in the input signal level when the input signal applied to the input terminal changes from H-level to L-level.

In the in-phase and/or opposite-phase signal output circuit, when the level of the input signal at the first and/or second input terminal changes, the input signal is applied to the control terminal of the first and/or fourth or second and/or fifth switching element. Therefore, any one of the two switching elements connected between the high supply voltage side and the low supply voltage side is turned on at high response speed in response to the level change, so that the output signal levels of the first and/of second output terminals change at high response speed. After that, the input signal is applied to the control terminal through circuits of a larger number of stages to maintain the turn-on state stably.

In the two-phase signal output circuit, since the outputs of the in-phase and/or opposite-phase signal output circuits change at high response speed in response to the level change of the input signal, the two in-phase and opposite-phase output signals can be outputted without any phase difference.

BRIEF DESCRIPTION OF THE DRAWINGS

FIG. 1 is a circuit diagram showing a first embodiment of the signal output circuit according to the present invention;

FIG. 2 is a circuit diagram showing a second embodiment of the signal output circuit according to the present invention;

FIG. 4 is circuit diagram showing a first example of the prior art signal output circuits;

FIG. 5 is circuit diagram showing a second example of the prior art signal output circuits;

FIGS. 6(A), 6(B) and 6(C) are waveform diagrams for assistance in explaining the prior art signal output circuit shown in FIG. 4.

DETAILED DESCRIPTION OF THE PREFERRED EMBODIMENTS

Figure 3A:
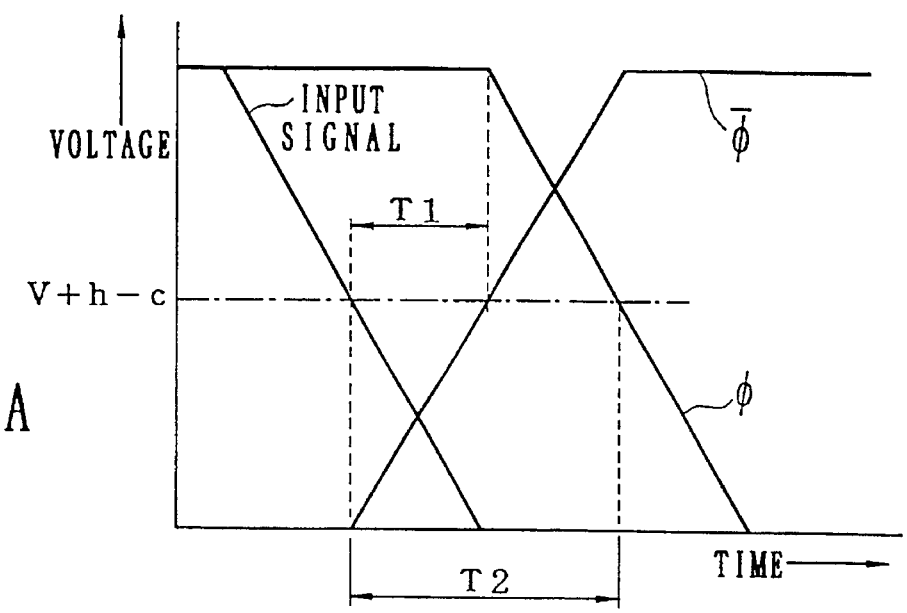
FIGS. 3(A) and (B) are waveform diagrams for assistance in explaining the operation of the signal output circuit shown in FIG. 1, in comparison with the prior art signal output circuit shown in FIG. 4.

Embodiments of the signal output circuit according to the present invention will be described hereinbelow with reference to the attached drawings.

(First Embodiment)

FIG. 1 is a circuit diagram showing a first embodiment of the signal output circuit according to the present invention.

In FIG. 1, an input signal /EN inputted through an input terminal 3 is given to three inverters 6A, 1A and 8, the three gates of two NMOS transistors 30 and 31 and a PMOS transistor 29, respectively. An output of the inverter 1A is connected to an output terminal 4A, and an output of the inverter 6A is give to the base of the NPN transistor 9A. The collector of this NPN transistor 9A is connected to a supply voltage Vcc, and the emitter thereof is connected to the output terminal 4A.

On the other hand, an output of the inverter 8 is connected to two inverters 2 and 7. An output of the inverter 2 is connected to an output terminal 5, and an output of the inverter 7 is connected to the emitter of an NPN transistor 10. The collector of this NPN transistor 10 is connected to the supply voltage Vcc, and the emitter thereof is connected to the output terminal 5.

Further, the drain of the NMOS transistor 31 is connected to the supply voltage Vcc, and the source thereof is connected to the output side of the inverter 7, that is, the base of the NPN transistor 10.

Further, the collector of an NPN transistor 35 is connected to the output terminal 5, and the emitter thereof is connected to ground GND. The base of this NPN transistor 35 is connected to the drains of the NMOS transistor 30 and an NMOS transistor 32. The sources of these NMOS transistors 30 and 32 are connected in common to the ground GND. These NMOS transistors 30 and 32 serve to connect the base of the NPN transistor 35 to the ground GND.

A signal at the output terminal 5 is inputted to an inverter 28. An output of this inverter 28 is connected to the gates of the NMOS transistor 32 and a PMOS transistor 33.

The source of this PMOS transistor 33 is connected to the supply voltage Vcc, and the drain thereof is connected to the source of the PMOS transistor 29.

The drains of these MOS transistors 29, 30 and 32 are connected in common, and the sources of the two NMOS transistors 30 and 32 are connected to the ground GND.

The circuit shown in FIG. 1 is constructed in such a way that a signal /φ is outputted through the output terminal 4 and a signal φ (opposite in phase to the signal /φ) is outputted through the output terminal 5 both on the basis of the signal /EN inputted through the input terminal 3. That is, the signal φ in phase with the signal /EN is generated by a circuit block 37 and then outputted through the output terminal 5.

The operation of the circuit shown in FIG. 1 will be described hereinbelow.

First, the systems for generating the signal /EN and the opposite-phase signal /φ are of orthodox construction in the same way as with the case of the second prior art example shown in FIG. 5. That is, the signal /EN is inverted through the inverter 1A, and the NPN transistor 9A is turned on through the inverter 6A to pull up the high-level output signal /φ at the output terminal 4A.

On the other hand, the signal φ in phase with the signal /EN is generated by the circuit block 37.

First, when the signal /EN is at a high level, since this signal is given to the gate of the NMOS transistor 31, the NMOS transistor 31 is turned on. Further, the output of the inverter 8 is at the low level, so that the outputs of the inverters 7 and 2 are both at the high level. Accordingly, the signal φ outputted through the output terminal 5 is at the high level.

On the other hand, since a base current is supplied to the base of the NPN transistor 10 from the NMOS transistor 31 and the inverter 7, the NPN transistor 10 is turned on, so that the output terminal 5 is pulled up to the supply voltage Vcc.

On the other hand, since the gates of the MOS transistors 29 and 30 are at the high level on the basis of the signal /EN inputted through the input terminal 3. The PMOS transistor 29 is turned off and the NMOS transistor 30 is turned on.

On the other hand, since the output terminal 5 is at the high level, the output of the inverter 28 is at the low level, so that the gate of the NMOS transistor 32 is at the low level. Accordingly, the NMOS transistor 32 is turned off. In other words, since the base of the NPN transistor 35 is set to the ground level GND through the NMOS transistor 30, the NPN transistor 35 is turned off.

Further, the output of the inverter 28 is inputted to the gate of the PMOS transistor 33, the MOS transistor 28 is turned on. In this case, however, since the PMOS transistor 29 is kept turned off, the on-state of the PMOS transistor 33 exerts no influence upon the circuit.

Here, the operation of when the signal /EN inputted through the input terminal 3 changes from the high level to the low level will be explained hereinbelow.

In response to the low-level signal /EN, the NMOS transistor 31 is first turned off, so that the base current of the NPN transistor 10 is supplied from only the inverter 7. On the other hand, since the level of the inverter 8 changes, the inverter 7 begins to drop to the low level. In this state, however, since the base current supplied from the inverter 7 to the NPN transistor 10 is not sufficient, the NPN transistor 10 is half turned on.

On the other hand, the low-level signal /EN turns on the PMOS transistor 29 and turns off the NMOS transistor 30, respectively. As a result, since a sufficient base current can be supplied to the NPN transistor 35 through the two PMOS transistors 33 and 29, the NPN transistor 35 can be turned on perfectly, so that the level of the output terminal 5 is pulled down to the low level.

As a result, the signal φ at the output terminal 5 drops to the low level at a high speed, that is, down to an operation threshold value Vth-C of the succeeding stage CMOS logic at a high speed.

After that, the base current of the NPN transistor 10 is cut off perfectly through the inverters 8 and 7, so that the NPN transistor 10 can be turned off perfectly. On the other hand, the output terminal 5 is decided at the low level through the inverter 2.

On the other hand, since the low level signal at the output terminal 5 is inverted to the high level through the inverter 28, and then applied to the gates of the MOS transistors 33 and 32, the PMOS transistor 33 is turned off, so that the base current to the NPN transistor 35 is cut off. In addition, since the NMOS transistor 32 is turned on, the base of the NPN transistor 35 is fixed to the ground level GND. As a result, the NPN transistor 35 is turned off. In other words, the low level of the signal φ the output terminal 5 can be held by the inverter 2.

Now, the operation of when the signal /EN inputted through the input terminal 3 changes from the low level to the high level will be explained hereinbelow.

In response to the high-level signal /EN, the NMOS transistor 31 is first turned on, so that a sufficient base current is supplied to the NPN transistor 10. In this state, the output terminal 5 kept at the low level by only the output of the inverter 2 is pulled up to the high level at a high speed and thereby reaches an operation threshold value Vth-C of the succeeding stage CMOS logic at a high speed.

On the other hand, the high-level signal /EN turns off the PMOS transistor 29 and on the NMOS transistor 30, respectively. Further, at this time point, since the PMOS transistor 33 is turned off, the base of the NPN transistor 35 is kept at the ground level GND at it is.

After that, since the output of the inverter 8 changes to the low level, the outputs of the inverters 2 and 7 are both at the high level, so that the output signal φ at the terminal 5 is decided at the high level.

In this case, although the high level signal at the output terminal 5 turns on the PMOS transistor 33 through the inverter 28, since the PMOS transistor 29 is turned off, base of the NPN transistor 35 is kept at the ground level GND as it is through the NMOS transistors 32 and 30, so that the NPN transistor 35 is kept turned off.

As described above, the high level at the output terminal 5 is decided and held at the pull-up side level by the output of the inverter 2 and the NPN transistor 10. In other words, when the signal /EN inputted through the input terminal 3 changes from the high level to the low level, the transition speed can be increased at the output terminal 5 from the high level to the low level, by turning on the NPN transistor 10 half through the NMOS transistor 31 directly connected to the input terminal 3, and in addition by turning on the NPN transistor 35 instantaneously through the MOS transistors 29 and 30 both directly connected to the input terminal 3.

In contrast with this, when the signal /EN changes from the low level to the high level, the transition speed can be increased at the output terminal 5 from the low level to the high level, by turning on the NPN transistor 10 through the NMOS transistor 31 directly connected to the input terminal 3.

After that, the dc output can be held by the output of the inverter 2 whose level changes later.

The above-mentioned operation of the first embodiment will be explained with reference a waveform diagram shown in FIG. 3(B), in comparison with that of the first prior art example shown in FIG. 4.

First, in the case of the prior art output circuit shown in FIG. 4, as shown in FIG. 3(A), when the input signal /EN changes from the high level to the low level, the signal /ϕ opposite in phase to the signal /EN changes from the low level to the high level being delayed by a delay time T1. On the other hand, the signal ϕ in phase with the signal /EN changes from the high level to the low level being delayed by a delay time T2. In other words, the signal ϕ is delayed markedly with respect to the signal /ϕ in dependence upon the number of states of the circuits intervening between the input and output terminals 3 and 5.

Figure 3B:
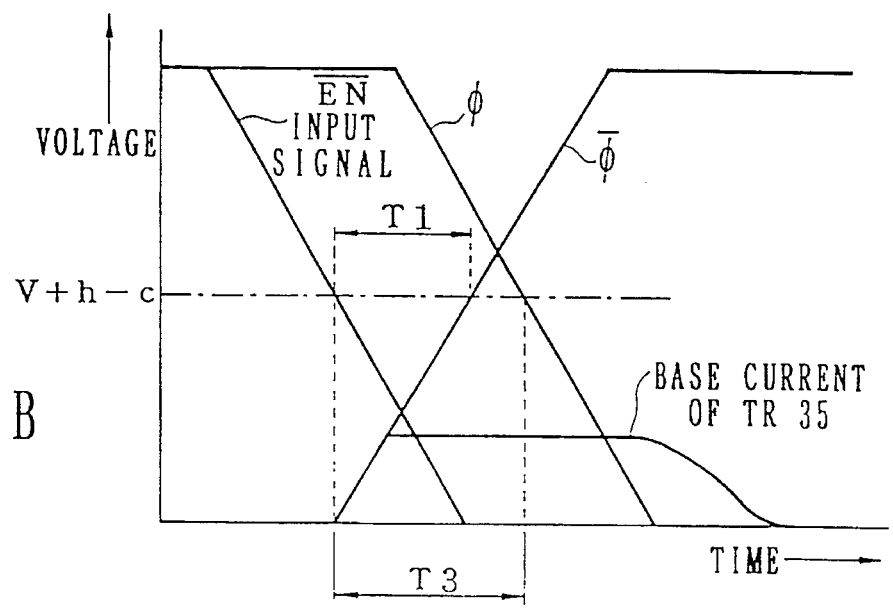
Figure 7:
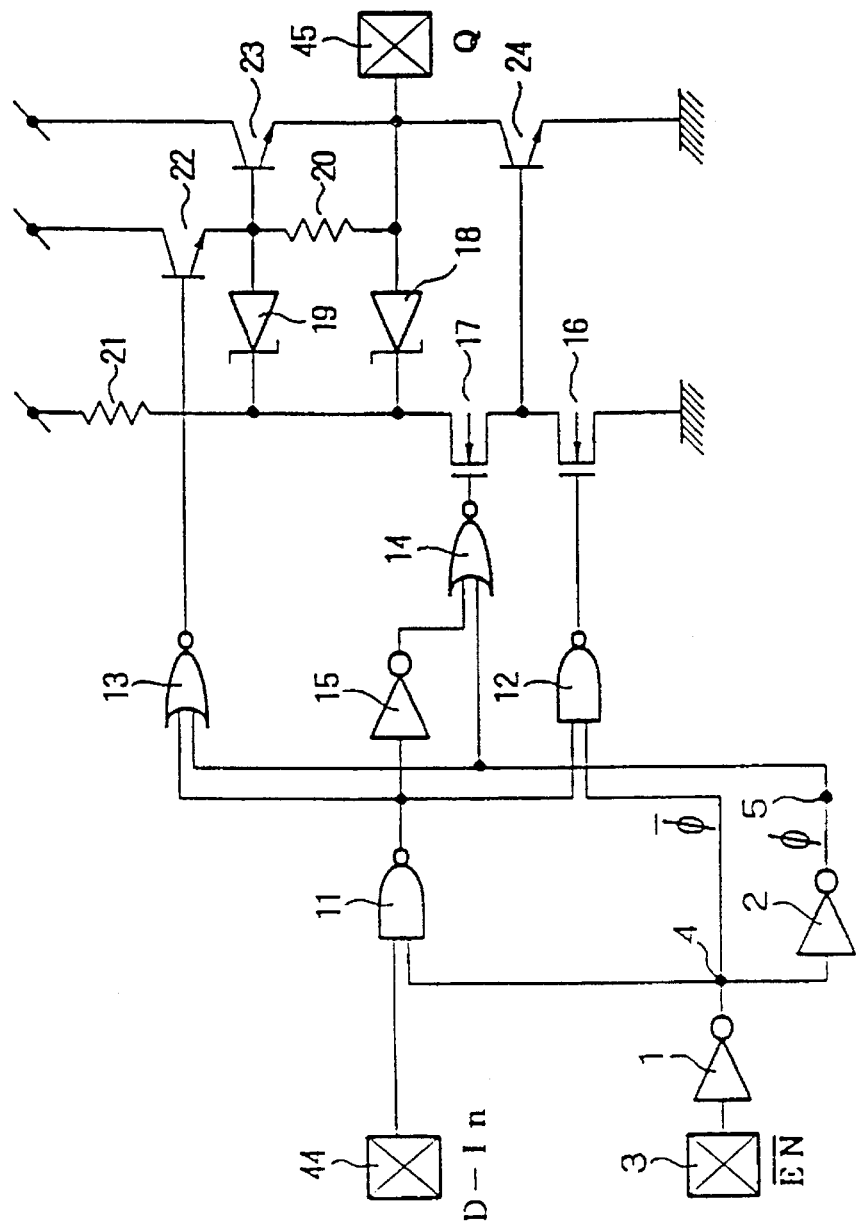
FIG. 7 is circuit diagram showing a third example of the prior art signal output circuits.

In contrast with this, in the case of the first embodiment shown in FIG. 1, as shown in FIG. 3(B), when the input signal /EN changes from the high level to the low level, the signal /ϕ opposite in phase to the signal /EN changes from the low level to the high level being delayed by a delay time T1 in the same way as with the case of the prior art output circuit. However, since the signal ϕ in phase with the signal /EN is pulled down forcedly by the signal transition circuits including the NPN transistor 35 (the number of stages intervening between the input and output terminals 3 and 5 is small), the signal ϕ can be changed from the high level to the low level within a very short delay time T3. As a result, it is possible to maintain the ideal phase relationship between the signal /ϕ (at the output terminal 4) and the signal ϕ (at the output terminal 5) when seen from the viewpoint of the threshold value level Vth-C of the succeeding stage CMOs logic.

(Second Embodiment)

FIG. 2 is a circuit diagram showing a second embodiment of the signal output circuit according to the present invention.

In FIG. 2, an input signal /EN inputted through an input terminal 3 is given to two inverters 1 and 6, the gates of an NMOS transistor 40, and a circuit block 37 constructed in the same way as with the case of the first embodiment shown in FIG. 1. An output of the inverter 1 is supplied to an output terminal 4, and an output of the inverter 6 is connected to the base of an NPN transistor 9. The emitter of this NPN transistor 9 is connected to a supply voltage Vcc.

Further, the collector of an NPN transistor 42 and an inverter 38 are connected to an output terminal 4. The emitter of the NPN transistor 42 is connected to ground GND.

An output of the inverter 38 is connected to the gates of a PMOS transistor 39 and an NMOS transistor 41. The source of the PMOS transistor 39 is connected to the supply voltage Vcc and the source of the NMOS transistor 41 is connected to the ground GND. The drain of the PMOS transistor 39 is connected to the drain of the NMOS transistor 40. The source of the NMOS transistor 40 is connected to the base of an NPN transistor 42 together with the drain of the NMOS transistor 41.

The circuit shown in FIG. 2 is constructed in such a way that a signal /ϕ is outputted through the output terminal 4 and a signal ϕ (opposite in phase to the signal /ϕ) is outputted through the output terminal 5 both on the basis of the signal /EN inputted through the input terminal 3. That is, the signal ϕ in phase with the signal /EN is generated by the circuit block 37 and then outputted through the output terminal 5. On the other hand, the signal /ϕ opposite in phase to the signal /EN is outputted through the output terminal 4 via a circuit block 43.

The operation of the circuit shown in FIG. 2 will be described hereinbelow.

The operation of the circuit block 37 for generating the signal ϕ in phase with the signal /EN inputted through the input terminal 3 is quite the same as with the case of the first embodiment shown in FIG. 1. The signal ϕ is outputted through the output terminal 5.

On the other hand, the circuit block 43 operates to generate the signal /ϕ opposite in phase to the signal /EN inputted through the input terminal 3. The signal /ϕ is outputted through the output terminal 4.

Now, when the signal /EN inputted through the input terminal 3 is at the high level, the output terminal 4 is at the low level through the inverter 1. On the other hand, the output of the inverter 6 is also at the low level, so that the NPN transistor 9 is turned off.

The low level at the output terminal 4 is inverted to the high level through the inverter 38, and then applied to the gates of the PMOS transistor 39 and the NMOS transistor 41. As a result, the PMOS transistor 39 is turned off and the NMOS transistor 41 is turned on. Further, since the gate of the NMOS transistor 40 is connected to the high level input terminal 3, the NMOS transistor 40 is turned on. However, since the PMOS transistor 39 is turned off, the base of the NPN transistor 42 is held at the ground level GND by the NMOS transistor 41, so that the NPN transistor 42 is turned off.

Here, the case where the signal /EN at the input terminal 3 changes from the high level to the low level will be explained hereinbelow.

When the input terminal 3 changes from the high level to the low level, the NMOS transistor 40 is first turned off, and then the outputs of the two inverters 1 and 6 changes to the high level.

As a result, the output terminal 4 changes to the high level through the inverter 1, so that the NPN transistor 9 is turned on by the inverter 6 being pulled up to the high level.

After that, the output of the inverter 38 changes to the low level, so that the PMOS transistor 39 is turned on and the NMOS transistor 41 is turned off. However, since the NMOS transistor 40 has been already turned off, a base current is not supplied to the NPN transistor 42, so that the NPN transistor 42 is kept turned off.

On the other hand, when the input terminal 3 changes from the low level to the high level, first the NMOS transistor 40 is turned on. As a result, it is possible to supply a sufficient base current from the PMOS transistor 39 (still kept turned on at this time point) to the base of the NPN transistor 42 through the NMOS transistor 40. As a result, the level of the output terminal 4 is pulled down to the low level at a high speed.

After that, since the outputs of the two inverters 1 and 6 change to the low level, the NPN transistor 9 is turned off, so that the output terminal 4 is decided at the low level. As a result, the output of the inverter 38 is at the high level, so that the PMOS transistor 39 is turned off and the NMOS transistor 41 is turned on.

As a result, since the base current is not supplied to the NPN transistor 42, the NPN transistor 42 is turned off.

After that, the output terminal 4 is kept at the low level through the inverter 1.

In the output circuit shown in FIG. 2, the transition the during which the signal /ϕ at the output terminal 4 changes from the high level to the low level is shortened markedly, by utilization of the fact that the operation of the NMOS transistor 40 and the NPN transistor 42 precedes that of the other circuits.

As described above, in the signal output circuit according to the present invention, the bipolar transistor is allowed to decide the levels of the output terminals 4 and 5 in advance and further the decided levels are held by the CMOS transistors after the levels have been once decided, on the basis of a preferable combination of the fact that the base voltage Vbe of a bipolar transistor incorporated in a BiC-MOS circuit is relatively at the low level and the fact that the threshold value Vth-C of the CMOS transistors resides between the supply potential Vcc and the ground level GND. Accordingly, it is possible to shorten the delay time markedly from when the level at the input terminal 3 changes to when the levels at the output terminals 4 and 5 change.

Further, in the embodiments of the signal output circuits according to the present invention, the circuit is divided into a circuit for maintaining the output signal level and a circuit for changing the output signal level, and in addition the level changing circuit is constructed by a bipolar circuit of high-load driving capability. Therefore, it is possible to reduce the number of the logic pass stages, shorten the delay time, and design the phase relationship between one-phase input and two-phase inputs under ideal conditions, so that there exists such an effect as to be effectively applied to logic circuits such as clocked driver, three-state control, etc.

According to the present invention, since the output circuit is controlled by a signal or signals obtained by an input signal passed through a small number of circuit stages, it is possible to obtain the one- or two-phase signal output circuit which can obtain an output signal or output signals of shorter phase delay, that is, of excellent response characteristics to the level change of the input signal.

What is claimed is:

1. A signal output circuit comprising:
   an input terminal for receiving an input signal (/EN);
   a primary signal output circuit comprising:
   first and second inverters connected in series,
   an output-side terminal for outputting a corresponding primary signal being one of in phase with and opposite in phase to the input signal (/EN),
   a first switching means connected between a high voltage supply terminal and said at least one output-side terminal,
   a second switching means connected between the high voltage supply terminal and a control terminal of said first switching means, a control terminal of said second switching means being connected to said input terminal, and
   a third inverter connected between a junction point between said first and second inverters and said control terminal of said first switching means;
   an output terminal connected to the output-side terminal; and
   a low-level signal output circuit comprising a grounding switching means connected between said output terminal and a ground terminal, for, under a condition when said at least one primary signal of said primary signal output circuit is transitioning to output a primary low-level signal in response to the input signal (/EN), outputting a secondary low-level signal and further applying the outputted secondary low-level signal to said output terminal, before the primary low-level signal is outputted from said primary signal output circuit.

2. The signal output circuit of claim 1, wherein said output-side terminal of said primary signal output circuit comprises an in-phase output-side terminal and outputs only a primary signal in phase with the input signal (/EN).

3. The signal output circuit of claim 2, wherein said low-level signal output circuit comprises means, connected between said input terminal and said output terminal, for applying the secondary low-level signal to said output terminal based on the input signal at said input terminal and the at least one primary signal at a corresponding one of said at least one output-side terminal.

4. The signal output circuit of claim 2, wherein said low-level signal output circuit comprises:
   a control circuit connected between said input terminal and the at least one output-side terminal and further to a control terminal of said at least one grounding switching means, wherein said control circuit turns on said at least one grounding switching means in response to a low-level of the input signal (/EN), prior to the primary signal output circuit outputting a low-level output at said at least one output-side terminal.

5. The signal output circuit of claim 2, wherein said low-level signal output circuit outputs the secondary low level signal when the input signal (/EN) is at a low level and further comprises:
   a control circuit comprising:
   first and second P-channel transistors and a first N-channel transistor all connected in series between a high voltage supply terminal and the ground terminal,
   a second N-channel transistor connected between a control terminal of said grounding switching means and the ground terminal, and
   an inverter connected between said output terminal and a control terminal of said first P-channel transistor, wherein
   control terminals of said second P-channel and first N-channel transistors being connected to said input terminal, a junction point between said second P-channel and first N-channel transistors being connected to a control terminal of said grounding switching means, and an output terminal of said inverter being connected to a control terminal of said fourth transistor.

6. The signal output circuit of claim 2, further comprising:

an opposite-phase signal output terminal for outputting a signal opposite in phase to the input signal (/EN) applied to said input terminal;

a supply switching means connected between a high voltage supply terminal and said opposite-phase signal output terminal;

a fourth inverter connected between said input terminal and a control terminal of said supply switching means; and a fifth inverter connected between said input terminal and said opposite-phase signal output terminal.

7. The signal output circuit of claim 3, further comprising:

an opposite-phase signal output terminal for outputting a signal opposite in phase to the input signal (/EN) applied to said input terminal;

a supply switching means connected between a high voltage supply terminal and said opposite-phase signal output terminal;

a fourth inverter connected between said input terminal and a control terminal of said supply switching means; and a fifth inverter connected between said input terminal and said opposite-phase signal output terminal.

8. The signal output circuit of claim 4, further comprising:

an opposite-phase signal output terminal for outputting a signal opposite in phase to the input signal (/EN) applied to said input terminal;

a supply switching means connected between a high voltage supply terminal and said opposite-phase signal output terminal;

a fourth inverter connected between said input terminal and a control terminal of said supply switching means; and a fifth inverter connected between said input terminal and said opposite-phase signal output terminal.

9. The signal output circuit of claim 5, further comprising:

an opposite-phase signal output terminal for outputting a signal opposite in phase to the input signal (/EN) applied to said input terminal;

a supply switching means connected between a high voltage supply terminal and said opposite-phase signal output terminal;

a fourth inverter connected between said input terminal and a control terminal of said supply switching means; and a fifth inverter connected between said input terminal and said opposite-phase signal output terminal.

10. An in-phase signal output circuit for outputting from an output terminal an output signal in phase with an input signal (/EN) applied to an input terminal, the circuit comprising:

first and second switching means connected in series between a high voltage supply and a low voltage supply, a junction point between said first and second switching means connected to the output terminal;

third switching means turned on/off in response to a H/L level of the input signal applied to the input terminal and connected between the high voltage supply and a control terminal of said first switching means in such a way that said first switching means is turned on whenever said third switching means is turned on;

an even-stage of inverters connected between the input terminal and the output terminal;

a control inverter having a control inverter input and a control inverter output, said control inverter input connected to a junction between two inverters such that there is an odd number of such inverters between the input terminal and the junction in the even-stage of inverters and said control inverter output connected to both an output of the third switching means and a control input of the first switching means; and a switching element control means connected between the input terminal and a control terminal of said second switching means, for keeping said second switching means turned off when an input signal applied to the input terminal is in a steady state, but for turning said second switching means from off to on transitionally at a high response speed when the input signal applied to the input terminal changes from H-level to L-level.

11. An opposite-phase signal output circuit for outputting from an output terminal an output signal opposite in phase to an input signal (/EN) applied to an input terminal, which comprises;

first and second switching means connected in series between a high voltage supply and a low voltage supply, a junction point between said first and second switching means being connected to the output terminal;

a first inverter connected between the input terminal and a control terminal of said first switching means;

a second inverter connected between the input terminal and the output terminal; and switching element control means connected between the input terminal and a control terminal of said second switching means, for keeping said second switching means turned off when an input signal applied to the input terminal is in a steady state, but for turning said second switching means from off to on transitionally at a high response speed when the input signal applied to the input terminal changes from H-level to L-level.

12. The opposite-phase signal output circuit as claimed in claim 31, wherein the switching element control means comprises:

a first P-channel transistor and first and second N-channel transistors all connected in series between the high voltage supply and the low voltage supply, wherein a control terminal of said first N-channel transistor is connected to said input terminal; and a third inverter having an inverter input, connected to the output terminal, and an inverter output, connected to control terminals of said first P-channel and second N-channel transistors.

* * * * *